United States Patent
Wu et al.

(10) Patent No.: US 10,615,814 B1
(45) Date of Patent: Apr. 7, 2020

(54) PIPELINED ANALOG-TO-DIGITAL CONVERTER

(71) Applicant: REALTEK SEMICONDUCTOR CORPORATION, Hsinchu (TW)

(72) Inventors: Chien-Ming Wu, Hsinchu County (TW); Liang-Huan Lei, Kaohsiung (TW); Shih-Hsiung Huang, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/428,282

(22) Filed: May 31, 2019

(30) Foreign Application Priority Data

Sep. 13, 2018 (TW) .............................. 107132200 A

(51) Int. Cl.
*H03M 1/12* (2006.01)
(52) U.S. Cl.
CPC ..................................... *H03M 1/12* (2013.01)
(58) Field of Classification Search
None
See application file for complete search history.

(56) References Cited

U.S. PATENT DOCUMENTS

| | | | |
|---|---|---|---|
| 5,006,852 A * | 4/1991 | Goto | H03M 1/0845 341/155 |
| 5,719,750 A | 2/1998 | Iwane | |
| 5,789,797 A * | 8/1998 | Ikuta | H01L 27/0214 257/421 |
| 6,710,735 B1 | 3/2004 | Lin | |
| 2002/0014915 A1* | 2/2002 | Ishikawa | H01L 23/5223 327/564 |
| 2014/0062750 A1* | 3/2014 | Morie | G05F 3/16 341/155 |
| 2019/0165800 A1* | 5/2019 | Chen | H03M 1/164 |

FOREIGN PATENT DOCUMENTS

TW         I244827         12/2005

OTHER PUBLICATIONS

Taiwan Intellectual Property Office, OA letter of counterpart TW application of application No. 107132200 dated Apr. 23, 2019. English summary on p. 1.
H. Yu, et al. "A 12b 50MSPS 34mW pipelined ADC," 2008 IEEE Custom Integrated Circuits Conference, San Jose, CA, 2008, pp. 297-300. doi: 10.1109/CICC.2008.4672080.
C. Tseng et al., "A 6-Bit 1 GS/s Pipeline ADC Using Incomplete Settling With Background Sampling-Point Calibration," in IEEE Transactions on Circuits and Systems I: Regular Papers, vol. 61, No. 10, pp. 2805-2815, Oct. 2014.

* cited by examiner

*Primary Examiner* — Howard Williams
(74) *Attorney, Agent, or Firm* — WPAT, PC

(57) ABSTRACT

The present invention discloses a pipelined analog-to-digital converter (ADC) including a sub-ADC, a multiplying digital-to-analog converter (MDAC) and a decoder. The decoder provides a ground signal for the MDAC. The sub-ADC is electrically connected to a ground pad via a first metal trace, and the decoder is electrically connected to the ground pad via a second metal trace.

10 Claims, 5 Drawing Sheets

PIPELINED ANALOG-TO-DIGITAL CONVERTER

BACKGROUND OF THE INVENTION

1. Field of the Invention

The present invention generally relates to pipelined analog-to-digital converters (pipelined ADCs, also known as pipeline ADCs).

2. Description of Related Art

FIG. 1 shows a conventional pipelined analog-to-digital converter (pipelined ADC) 100. The pipelined ADC 100 includes a plurality of series-connected operational stages 110, a terminal ADC 120, and a digital correction circuit 130. After the differential input signal $V_{in}$ is processed by multiple operational stages in which comparison, subtraction, and amplification operations are conducted, the correction circuit 130 finally corrects the output of each operational stage 110 and the output of the terminal ADC 120 to generate a digital code D, which is the result the analog-to-digital conversion of the differential input signal $V_{in}$. The operation principles of the pipelined ADC 100 are well known to those of ordinary skill in the art and thus omitted for brevity.

FIG. 2 is a functional block diagram of the operational stage 110 of FIG. 1. The operational stage 110 includes a sub-ADC 112, a decoder 114, and a multiplying digital-to-analog converter (MDAC) 116. The sub-ADC 112, the decoder 114, and the MDAC 116 operate in accordance with a clock CLK which can be provided by a clock generator (not shown) of the pipelined ADC 100.

The sub-ADC 112 includes multiple comparators that compare the differential input signal $V_{in}$ with multiple predetermined voltages ($V_{R1}$ to $V_{Rn}$) to thereby generate a digital signal b. The number of comparators and the number of predetermined voltages (i.e., the numeral n) are related to the number of bits of the pipelined ADC 100. The decoder 114 provides the reference voltage $V_{REF+}$, the reference voltage $V_{REF-}$, and/or the voltage $V_{CM\_REF}$ for the MDAC 116 according to the digital signal b. The voltage $V_{CM\_REF}$ is a common-mode voltage of the reference voltage $V_{REF+}$ and the reference voltage $V_{REF-}$. The MDAC 116 samples the differential input signal $V_{in}$, and performs subtraction and multiplication operations on the differential input signal $V_{in}$ according to the voltages provided by the decoder 114 to thereby generate the differential output signal $V_{out}$. The differential output signal $V_{out}$ becomes the differential input signal of the subsequent operational stage 110 or the terminal ADC 120.

To ensure a stable operation of the pipelined ADC 100, the voltage $V_{CM\_REF}$ should ideally be equal to the common-mode voltage $V_{CM\_PGA}$ of the differential input signal $V_{in}$, and the voltage difference between the reference voltage $V_{REF+}$ and the reference voltage $V_{REF-}$ is generally half of the allowed maximum peak-to-peak value $V_{pp\_max}$ of the differential input signal $V_{in}$. For example, if the differential input signal $V_{in}$ is constrained between the voltage VDD and ground (i.e., $V_{pp\_max}$=VDD−0=VDD), then $V_{REF+}-V_{REF-}$=$0.5V_{pp\_max}$=0.5VDD and $V_{CM\_REF}=V_{CM\_PGA}$=0.5VDD. FIG. 3 is a conventional circuit for generating the reference voltage $V_{REF+}$ and the reference voltage $V_{REF-}$. This circuit is well known to those of ordinary skill in the art and its details are not discussed herein for brevity. In order to satisfy the above requirements, the prior-art solution often makes $V_{REF+}$=0.75VDD and $V_{REF-}$=0.25VDD by adjusting the resistance values of the resistors R1 and R2 and the current of the current source Ir in FIG. 3. However, the above requirements limit the design flexibility of the reference voltage $V_{REF+}$ and the reference voltage $V_{REF-}$. Furthermore, the unit gain buffers 310 and 320 of FIG. 3 take up considerably large circuit areas.

SUMMARY OF THE INVENTION

In view of the issues of the prior art, an object of the present invention is to provide a pipelined analog-to-digital converter (pipelined ADC) to increase the design flexibility, reduce the circuit area, and improve the performance, so as to make an improvement to the prior art.

A pipelined ADC is provided. The pipelined ADC includes a sub-ADC, a multiplying digital-to-analog converter (MDAC), and a decoder. The decoder is configured to provide the MDAC with a ground signal. The sub-ADC is electrically connected to a ground pad via a first metal trace, and the decoder is electrically connected to the ground pad via a second metal trace.

Another pipelined ADC is provided. The pipelined ADC includes a sub-ADC, an MDAC, and a decoder. The decoder is configured to provide the MDAC with a ground signal. The sub-ADC is electrically connected to a first ground pad via a first metal trace, and the decoder is electrically connected to a second ground pad via a second metal trace.

Because the reference voltage provided to the MDAC is more stable in the pipelined ADCs of the present invention than in the prior-art pipelined ADCs, the pipelined ADCs of the present invention have the following advantages over the prior art: a smaller circuit area, higher design flexibility, improved operation stability, and higher accuracy.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a pipelined analog-to-digital converter (pipelined ADC). On account of that some or all elements of the pipelined ADC could be known, the detail of such elements is omitted provided that such detail has little to do with the features of this disclosure and this omission nowhere dissatisfies the specification and enablement requirements. A person having ordinary skill in the art can choose components or steps equivalent to those described in this specification to carry out the present invention, which means that the scope of this invention is not limited to the embodiments in the specification.

After conducting a number of careful researches, the inventors find that by adjusting the reference voltage of the comparator of the multiplying digital-to-analog converter (MDAC) 116, or by modifying the circuit design of the MDAC 116, it is possible to use ground or the ground level as the reference voltage $V_{REF-}$ of the decoder 114. This means that the decoder 114 provides the MDAC 116 with ground or the ground level to be used as its reference voltage, and such circuit design has at least the following advantages: (1) the circuit area is reduced because the unit gain buffer 320 is saved; (2) the design of the reference voltages $V_{REF+}$ and $V_{REF-}$ becomes more flexible; and (3) ground or the ground level has a stronger driving capability than other voltage levels. For more details of the circuit design discussed above, references can be made to the U.S. patent application Ser. No. 16/105,142.

Figure 1:
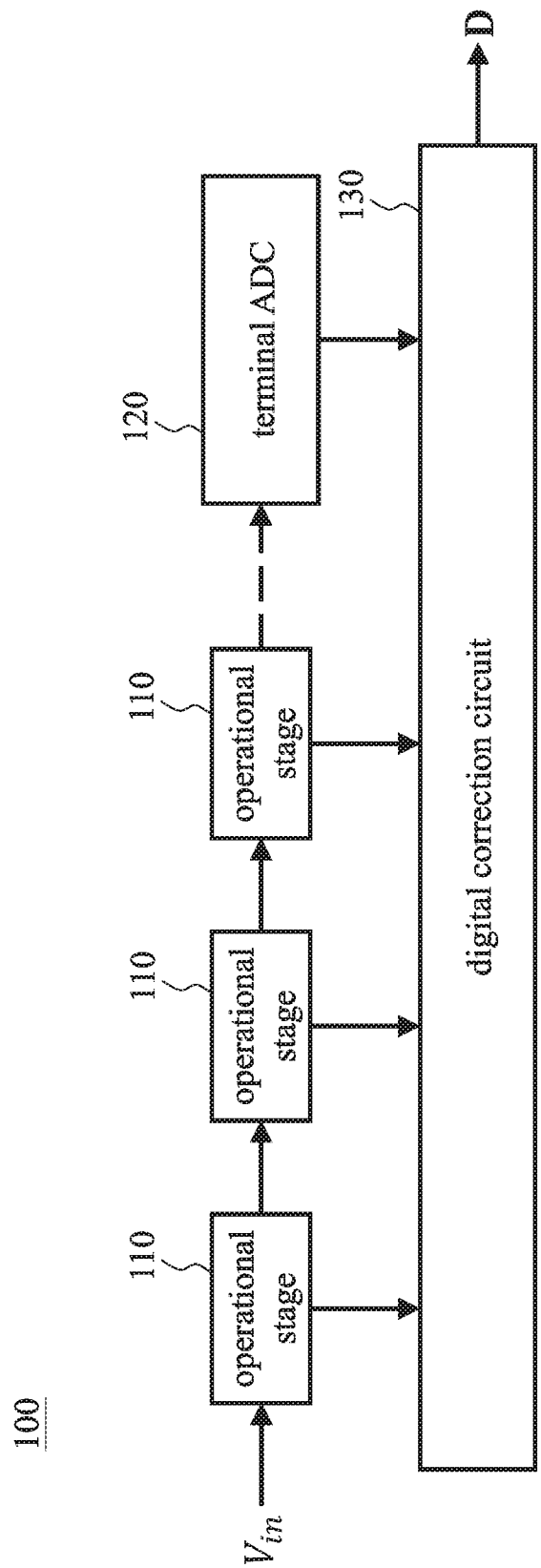
FIG. 1 illustrates a conventional pipelined analog-to-digital converter (pipelined ADC).
Figure 2:
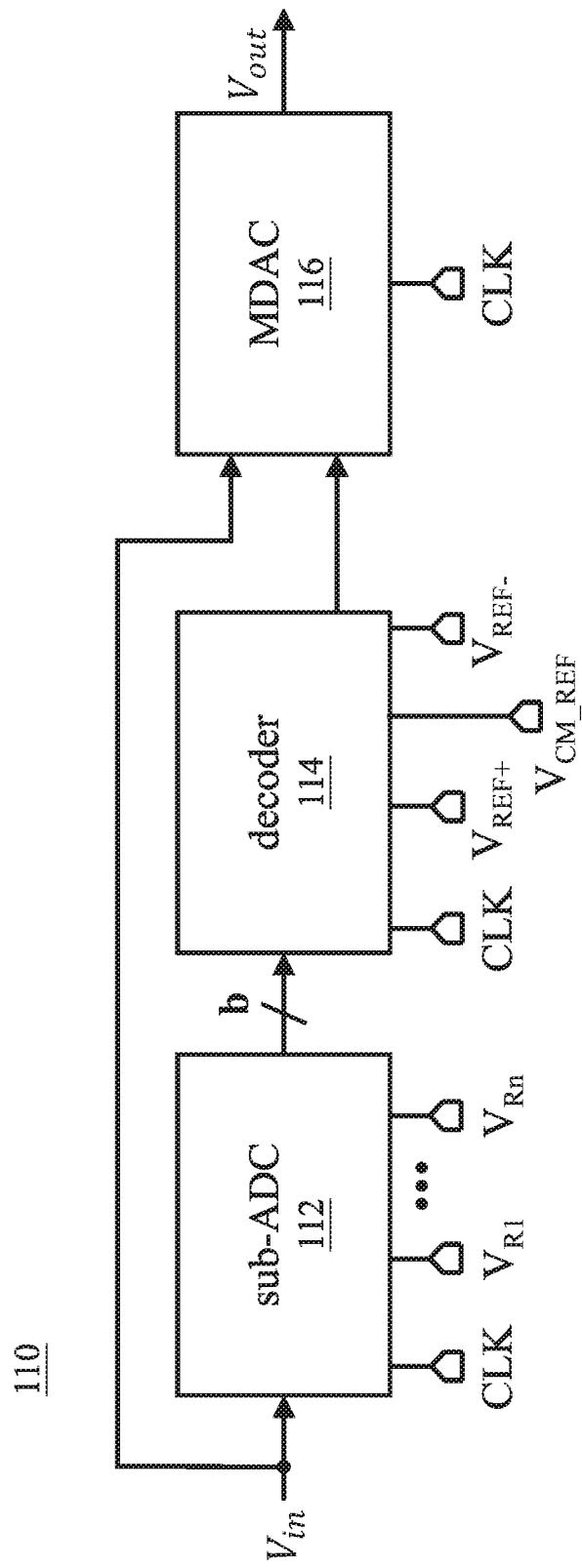
FIG. 2 illustrates a functional block diagram of one of the operational stages of FIG. 1.
Figure 3:
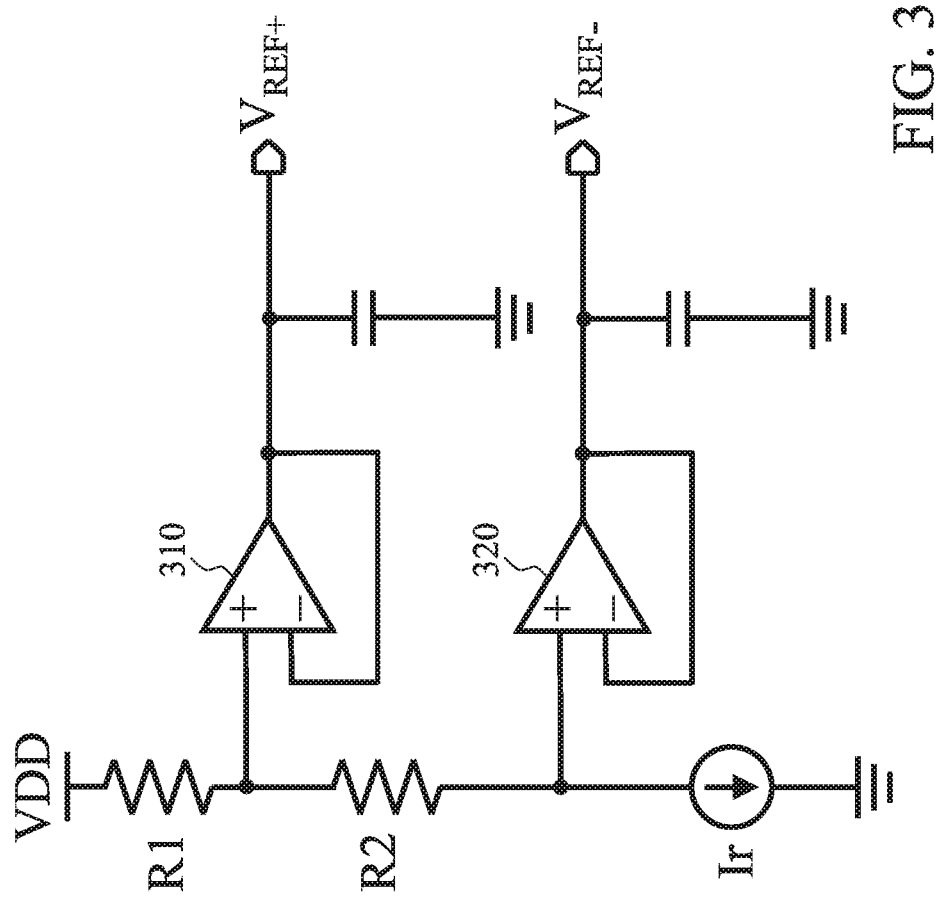
FIG. 3 illustrates a conventional circuit for generating the reference voltage $V_{REF+}$ and the reference voltage $V_{REF-}$.

Because in practical circuits both the sub-ADC 112 and the clock generator in FIG. 2 are very likely to be coupled to ground or receive the ground level or ground signal, the ground level or ground signal becomes unstable, more or less, due to the existence of parasitic resistance and/or parasitic capacitance on the circuits. When the decoder 114 shares ground or the ground level with the sub-ADC 112 and/or the clock generator, the reference voltage $V_{REF-}$ (i.e., the ground reference) becomes unstable, which causes the MDAC 116 to not operate properly or become erroneous and thereby leads to a decrease in the accuracy of the pipelined ADC 100.

Figure 4:
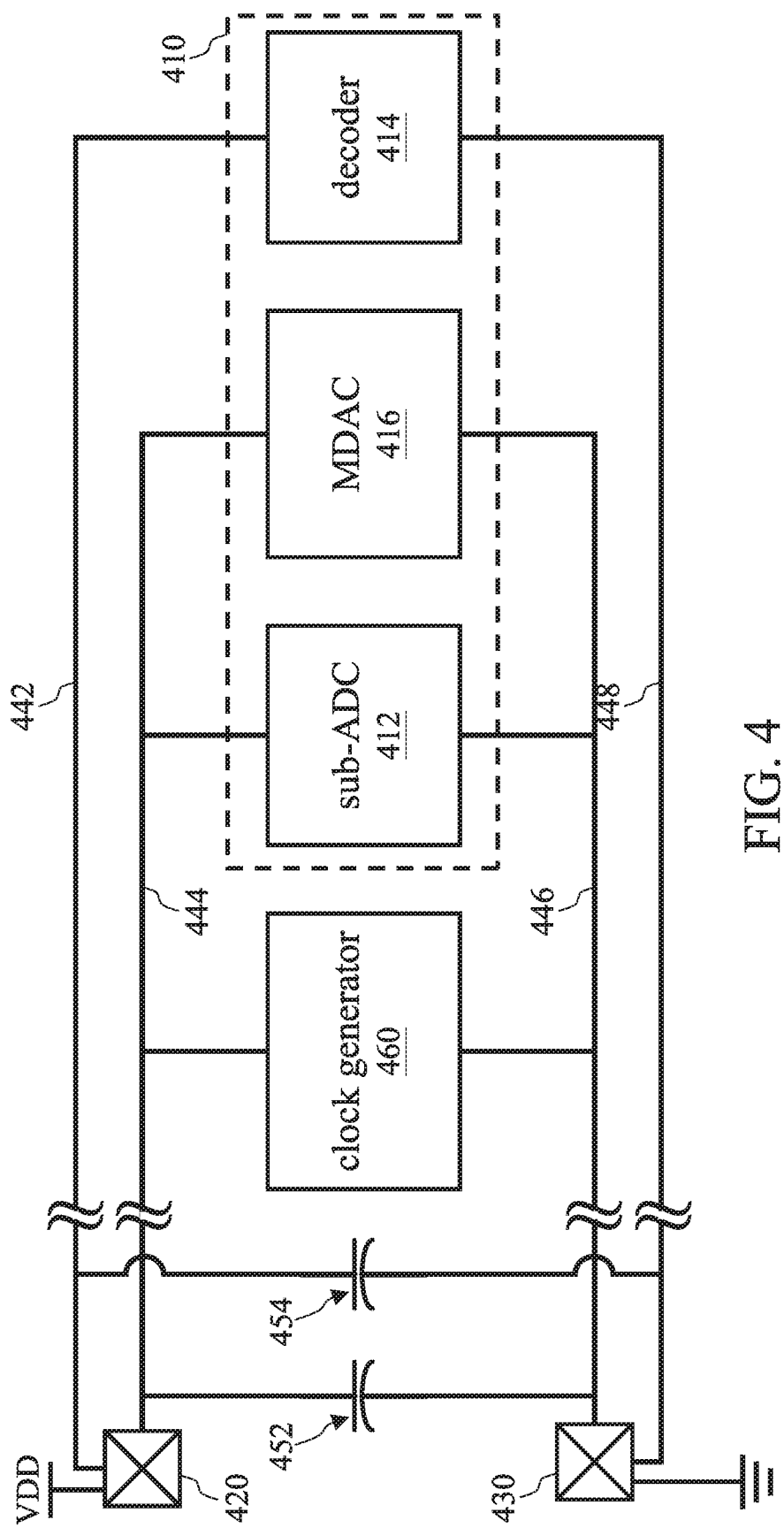
FIG. 4 illustrates a certain operational stage of a pipelined ADC in accordance with an embodiment of the present invention.

FIG. 4 shows a certain operational stage of a pipelined ADC in accordance with an embodiment of the present invention. The operational stage 410 includes a sub-ADC 412, a decoder 414, and an MDAC 416. The clock generator 460 is part of a pipelined ADC to which the operational stage 410 belongs, and the clock generator 460 provides a clock for the sub-ADC 412, the decoder 414, and the MDAC 416. The metal traces 442 and 444 are electrically connected to the power supply voltage pad 420 for transmitting or conducting the power supply voltage VDD. The metal traces 446 and 448 are electrically connected to the ground pad 430 for transmitting or conducting the ground signal (i.e., the ground level or ground reference). The functions and operations of the sub-ADC 412, the decoder 414, and the MDAC 416 are the same as or similar to those of the sub-ADC 112, the decoder 114, and the MDAC 116, respectively, and the details are thus omitted for brevity. For simplicity and ease of discussion, FIG. 4 shows only the power connections and ground connections but does not show the signal or data connections among the sub-ADC 412, the decoder 414, and the MDAC 416. References can be made to FIG. 2 for the signal or data connections.

The pipelined ADC to which the operational stage 410 belongs is implemented in a chip, and the power supply voltage pad 420 and the ground pad 430 are pads or pins of that chip. Through these pads or pins, the chip receives the power supply voltage VDD or the ground signal from the outside of the chip. More specifically, the circuits in the chip receives the power supply voltage VDD from the outside of the chip through the power supply voltage pad 420 and receives the ground signal from the outside of the chip through the ground pad 430 (in other words, the circuits are grounded through the ground pad 430). The power supply voltage pad 420 and the ground pad 430 can be shared by multiple operational stages of the pipelined ADC.

In the embodiment of FIG. 4, the sub-ADC 412, the MDAC 416, and the clock generator 460 are electrically connected to the power supply voltage pad 420 via the metal trace 444; the decoder 414 is electrically connected to the power supply voltage pad 420 via the metal trace 442; the sub-ADC 412, MDAC 416, and clock generator 460 are electrically connected to the ground pad 430 via the metal trace 446; and the decoder 414 is electrically connected to the ground pad 430 via the metal trace 448. The ground reference required by the MDAC 416 for operation is provided by the decoder 414 (i.e., the ground reference is transmitted via the metal trace 448), and the ground level required by the comparator (not shown) of the MDAC 416 is transmitted via the metal trace 446.

The arrangement of the metal traces in FIG. 4 ensures that the decoder 414 receives the power supply voltage VDD directly from the power supply voltage pad 420 and receives the ground signal directly from the ground pad 430. The decoder 414 uses the ground signal as its reference voltage, which corresponds to the reference voltage $V_{REF-}$ in FIG. 2. In other words, the power supply voltage VDD and the ground signal utilized by the decoder 414 are not interfered by the sub-ADC 412 and/or the clock generator 460 and are therefore relatively stable. As a result, the decoder 414 can provide relatively stable reference signals (including the ground signal). That is to say, the MDAC 416 can receive relatively stable reference signals (including the ground signal) from the decoder 414, and so the operation stability and accuracy of the pipelined ADC can be improved.

The above-mentioned chip may further include the capacitor 452 and capacitor 454. One end of the capacitor 452 is electrically connected to the metal trace 444, and the other end is electrically connected to the metal trace 446. One end of the capacitor 454 is electrically connected to the metal trace 442, and the other end is electrically connected to the metal trace 448. The capacitors 452 and 454 serve as stabilizing capacitors to reduce the disturbances on the power supply voltage VDD and the ground signal. The stable power supply voltage VDD and ground signal can render substantially constant the voltage difference between the reference voltages $V_{REF+}$ and $V_{REF-}$ provided by the decoder 414; hence, the MDAC 416 operates more correctly, which in turn makes an improvement to the performance of the pipelined ADC (e.g., having a better signal-to-noise-and-distortion ratio (SNDR)). The capacitors 452 and 454 are optional; that is, some embodiments do not implement these two capacitors, while others may implement only one of them.

The metal traces 442, 444, 446, and 448 can each be implemented in one or more metal layers of the semiconductor structure of the chip. In some embodiments, a substantial portion (e.g., more than 80%) of the metal trace 442, 444, 446, or 448 is implemented in the ultra-thick metal (UTM) layer of the semiconductor structure to reduce the resistance of the metal traces. The metal traces 442 and 444 are not connected to each other inside the chip, and are each connected to the power supply voltage pad 420. In other words, the metal traces 442 and 444 are two separate metal traces in the chip and are not electrically connected. Similarly, the metal traces 446 and 448 are not connected to each other inside the chip, and are each connected to the ground pad 430. In other words, the metal traces 446 and 448 are two separate metal traces in the chip and are not electrically connected.

Figure 5:
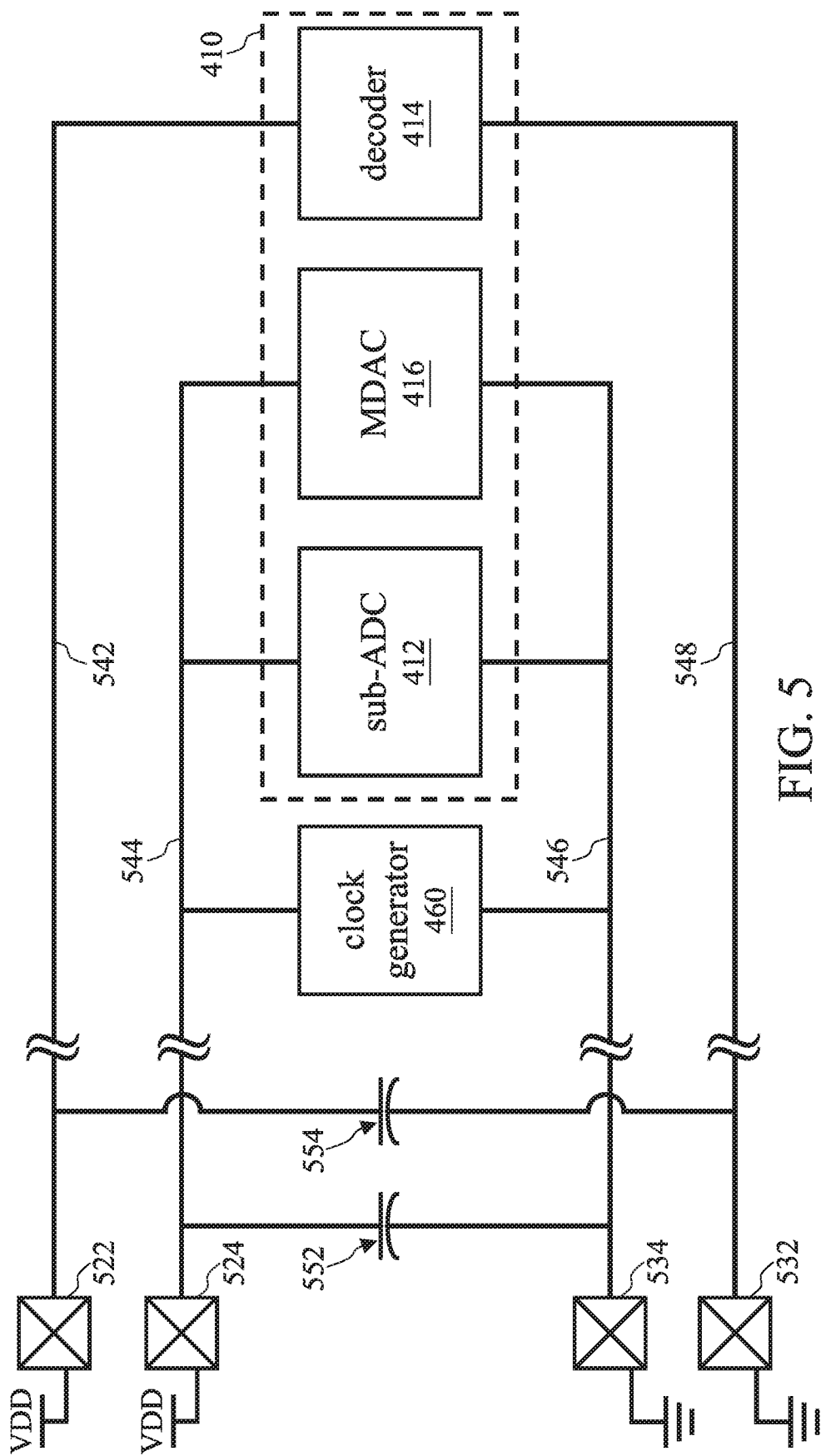
FIG. 5 illustrates a certain operational stage of a pipelined ADC in accordance with another embodiment of the present invention.

FIG. 5 shows a certain operational stage of a pipelined ADC in accordance with another embodiment of the present invention. The metal traces 542 and 544 are respectively electrically connected to the power supply voltage pads 522 and 524 for transmitting or conducting the power supply voltage VDD. The metal traces 546 and 548 are respectively electrically connected to the ground pads 534 and 532 for transmitting or conducting the ground signal. For simplicity, FIG. 5 shows only the power connections and ground connections but does not show the signal or data connections among the sub-ADC 412, the decoder 414, and the MDAC 416. References can be made to FIG. 2 for the signal or data connections.

The pipelined ADC to which the operational stage 410 belongs is implemented in a chip. The power supply voltage pad 522, the power supply voltage pad 524, the ground pad 532, and the ground pad 534 are pads or pins of that chip. Through these pads or pins, the chip receives the power supply voltage VDD or the ground signal from the outside of the chip. More specifically, the circuits in the chip receives the power supply voltage VDD from the outside of the chip through the power supply voltage pad 522 or the power supply voltage pad 524, and receives the ground signal from the outside of the chip through the ground pad 532 or the ground pad 534 (in other words, the circuits are grounded through the ground pad 532 or the ground pad 534). The power supply voltage pad 522, the power supply voltage pad 524, the ground pad 532, and the ground pad 534 can be shared by multiple operational stages of the pipelined ADC.

In the embodiment of FIG. 5, the sub-ADC 412, the MDAC 416, and the clock generator 460 are electrically connected to the power supply voltage pad 524 via the metal trace 544; the decoder 414 is electrically connected to the power supply voltage pad 522 via the metal trace 542; the sub-ADC 412, MDAC 416, and clock generator 460 are electrically connected to the ground pad 534 via the metal trace 546; and the decoder 414 is electrically connected to the ground pad 532 via the metal trace 548. The ground reference required by the MDAC 416 for operation is provided by the decoder 414 (i.e., the ground reference is transmitted via the metal trace 548), and the ground level required by the comparator (not shown) of the MDAC 416 is transmitted via the metal trace 546.

The arrangement of the metal traces in FIG. 5 ensures that the decoder 414 receives the power supply voltage VDD directly from the power supply voltage pad 522 and receives the ground signal directly from the ground pad 532. The decoder 414 uses the ground signal as its reference voltage, which corresponds to the reference voltage $V_{REF-}$ in FIG. 2. In other words, the power supply voltage VDD and the ground signal utilized by the decoder 414 are not interfered by the sub-ADC 412 and/or the clock generator 460 and are therefore relatively stable. As a result, the decoder 414 can provide relatively stable reference signals (including the ground signal). That is to say, the MDAC 416 can receive relatively stable reference signals (including the ground signal) from the decoder 414, and so the operation stability and accuracy of the pipelined ADC can be improved.

The above-mentioned chip may further include the capacitor 552 and capacitor 554. One end of the capacitor 552 is electrically connected to the metal trace 544, and the other end is electrically connected to the metal trace 546. One end of the capacitor 554 is electrically connected to the metal trace 542, and the other end is electrically connected to the metal trace 548. The capacitors 552 and 554 serve as stabilizing capacitors to reduce the disturbances on the power supply voltage VDD and the ground signal. The capacitors 552 and 554 are optional; that is, some embodiments do not implement these two capacitors, while others may implement only one of them.

The metal traces 542, 544, 546, and 548 can each be implemented in one or more metal layers of the semiconductor structure of the chip. In some embodiments, a substantial portion (e.g., more than 80%) of the metal trace 542, 544, 546, or 548 is implemented in the UTM layer of the semiconductor structure to reduce the resistance of the metal traces. The metal traces 542 and 544 are not connected to each other inside the chip, and are respectively connected to the power supply voltage pads 522 and 524. In other words, the metal traces 542 and 544 are two separate metal traces in the chip and are not electrically connected. Similarly, the metal traces 546 and 548 are not connected to each other inside the chip, and are respectively connected to the ground pads 534 and 532. In other words, the metal traces 546 and 548 are two separate metal traces in the chip and are not electrically connected.

Compared with FIG. 4, the decoder 414 of FIG. 5 can receive the power supply voltage VDD and the ground signal that are less disturbed or less likely to be disturbed because the decoder 414 of FIG. 5 does not share pads or pins with other circuits in the operational stage 410. As a result, the MDAC 416 of FIG. 5 can operate more stably, and, therefore, the accuracy of the pipelined ADC can be further improved.

Since a person having ordinary skill in the art can appreciate the implementation detail and the modification thereto of the present method invention through the disclosure of the device invention, repeated and redundant description is thus omitted. Please note that there is no step sequence limitation for the method inventions as long as the execution of each step is applicable. Furthermore, the shape, size, and ratio of any element and the step sequence of any flow chart in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A pipelined analog-to-digital converter (ADC), comprising:
    a sub-ADC;
    a multiplying digital-to-analog converter (MDAC); and
    a decoder configured to provide the MDAC with a ground signal;
    wherein the sub-ADC is electrically connected to a ground pad via a first metal trace, and the decoder is electrically connected to the ground pad via a second metal trace.

2. The pipelined ADC of claim 1 further comprising:
    a clock generator configured to provide a clock for the sub-ADC, the decoder, and the MDAC;

wherein the clock generator is electrically connected to the ground pad via the first metal trace.

3. The pipelined ADC of claim 1, wherein the sub-ADC is electrically connected to a power supply voltage pad via a third metal trace, and the decoder is electrically connected to the power supply voltage pad via a fourth metal trace.

4. The pipelined ADC of claim 3 further comprising:
a clock generator configured to provide a clock for the sub-ADC, the decoder, and the MDAC;
wherein the clock generator is electrically connected to the power supply voltage pad via the third metal trace.

5. The pipelined ADC of claim 3, wherein the pipelined ADC is fabricated in a chip, the chip comprises a first capacitor and a second capacitor, a first end of the first capacitor is electrically connected to the first metal trace, a second end of the first capacitor is electrically connected to the third metal trace, a first end of the second capacitor is electrically connected to the second metal trace, and a second end of the second capacitor is electrically connected to the fourth metal trace.

6. A pipelined analog-to-digital converter (ADC), comprising:
a sub-ADC;
a multiplying digital-to-analog converter (MDAC); and
a decoder configured to provide the MDAC with a ground signal;
wherein the sub-ADC is electrically connected to a first ground pad via a first metal trace, and the decoder is electrically connected to a second ground pad via a second metal trace.

7. The pipelined ADC of claim 6 further comprising:
a clock generator configured to provide a clock for the sub-ADC, the decoder, and the MDAC;
wherein the clock generator is electrically connected to the first ground pad via the first metal trace.

8. The pipelined ADC of claim 6, wherein the sub-ADC is electrically connected to a first power supply voltage pad via a third metal trace, and the decoder is electrically connected to a second power supply voltage pad via a fourth metal trace.

9. The pipelined ADC of claim 8 further comprising:
a clock generator configured to provide a clock for the sub-ADC, the decoder, and the MDAC;
wherein the clock generator is electrically connected to the first power supply voltage pad via the third metal trace.

10. The pipelined ADC of claim 8, wherein the pipelined ADC is fabricated in a chip, the chip comprises a first capacitor and a second capacitor, a first end of the first capacitor is electrically connected to the first metal trace, a second end of the first capacitor is electrically connected to the third metal trace, a first end of the second capacitor is electrically connected to the second metal trace, and a second end of the second capacitor is electrically connected to the fourth metal trace.

* * * * *